United States Patent
Nii

(10) Patent No.: US 12,209,160 B2
(45) Date of Patent: Jan. 28, 2025

(54) RESIN COMPOSITION, PREPREG, FILM WITH RESIN, SHEET OF METAL FOIL WITH RESIN, METAL-CLAD LAMINATE, AND PRINTED WIRING BOARD

(71) Applicant: Panasonic Intellectual Property Management Co., Ltd., Osaka (JP)

(72) Inventor: Daisuke Nii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/599,274

(22) PCT Filed: Mar. 24, 2020

(86) PCT No.: PCT/JP2020/013020
§ 371 (c)(1),
(2) Date: Sep. 28, 2021

(87) PCT Pub. No.: WO2020/203469
PCT Pub. Date: Oct. 8, 2020

(65) Prior Publication Data
US 2022/0185945 A1 Jun. 16, 2022

(30) Foreign Application Priority Data
Mar. 29, 2019 (CN) .......................... 201910248491.4

(51) Int. Cl.
*B32B 3/10* (2006.01)
*B32B 5/02* (2006.01)
(Continued)

(52) U.S. Cl.
CPC ................ *C08G 59/24* (2013.01); *B32B 5/02* (2013.01); *B32B 5/26* (2013.01); *B32B 15/14* (2013.01); *B32B 15/20* (2013.01); *B32B 17/10* (2013.01); *C08G 59/423* (2013.01); *C08J 5/244* (2021.05); *C08J 5/249* (2021.05); *C08K 3/36* (2013.01); *H05K 1/0366* (2013.01); *B32B 2250/40* (2013.01); *B32B 2260/021* (2013.01); *B32B 2260/046* (2013.01); *B32B 2262/101* (2013.01);
(Continued)

(58) Field of Classification Search
None
See application file for complete search history.

(56) References Cited

U.S. PATENT DOCUMENTS

2016/0369042 A1* 12/2016 Nii .......................... B32B 27/38

FOREIGN PATENT DOCUMENTS

| CN | 101845199 A | * | 9/2010 | |
| CN | 103724944 A | * | 4/2014 | ............ B32B 15/20 |

(Continued)

OTHER PUBLICATIONS

Machine translation of JP2000191953 (Year: 2000).*
(Continued)

*Primary Examiner* — Christopher M Polley
(74) *Attorney, Agent, or Firm* — Rimon P.C.

(57) ABSTRACT

A resin composition contains an epoxy compound and a curing agent. The epoxy compound includes a phosphorus-containing epoxy compound having a phosphorus atom in its (Continued)

molecule. The curing agent includes a phosphorus-containing acid anhydride having a phosphorus atom and an acid anhydride group in its molecule.

18 Claims, 5 Drawing Sheets

(51) Int. Cl.
 B32B 5/26 (2006.01)
 B32B 15/14 (2006.01)
 B32B 15/20 (2006.01)
 B32B 17/10 (2006.01)
 C08G 59/24 (2006.01)
 C08G 59/42 (2006.01)
 C08J 5/24 (2006.01)
 C08K 3/36 (2006.01)
 H05K 1/03 (2006.01)

(52) U.S. Cl.
 CPC . *B32B 2307/204* (2013.01); *B32B 2307/3065* (2013.01); *B32B 2307/732* (2013.01); *B32B 2457/08* (2013.01); *C08J 2363/00* (2013.01); *H05K 2201/029* (2013.01)

(56) References Cited

FOREIGN PATENT DOCUMENTS

| EP | 3620459 A1 | | 3/2020 |
| JP | 2000-007898 A | | 1/2000 |
| JP | 2000191953 A | * | 7/2000 |
| JP | 2000-239491 A | | 9/2000 |
| JP | 2000-344811 A | | 12/2000 |
| JP | 2001-283639 A | | 10/2001 |
| JP | 2010-191215 A | | 9/2010 |
| JP | 2019-044077 A | | 3/2019 |
| TW | 201708380 A | | 3/2017 |

OTHER PUBLICATIONS

Machine translation of CN-101845199-A (Year: 2009).*
Machine translation of CN-103724944-A (Year: 2013).*
International Search Report and Written Opinion issued in International Patent Application No. PCT/JP2020/013020, dated Jun. 16, 2020; with partial English translation.
Taiwanese Office Action and Search Report dated Aug. 8, 2023 issued in the corresponding Taiwanese Patent Application No. 109105016, with English translation of the Search Report.
Office Action issued in corresponding Chinese Application No. 202080021843.3, dated Dec. 22, 2023 w/English MT.

* cited by examiner

RESIN COMPOSITION, PREPREG, FILM WITH RESIN, SHEET OF METAL FOIL WITH RESIN, METAL-CLAD LAMINATE, AND PRINTED WIRING BOARD

CROSS-REFERENCE OF RELATED APPLICATIONS

This application is the U.S. National Phase under 35 U.S.C. § 371 of International Patent Application No. PCT/JP2020/013020, filed on Mar. 24, 2020, which in turn claims the benefit of Chinese Application No. 201910248491.4, filed on Mar. 29, 2019, the entire disclosures of which Applications are incorporated by reference herein.

TECHNICAL FIELD

The present disclosure generally relates to a resin composition, a prepreg, a film with resin, a sheet of metal foil with resin, a metal-clad laminate, and a printed wiring board. More particularly, the present disclosure relates to a resin composition including an epoxy compound and a curing agent, a prepreg, a film with resin, a sheet of metal foil with resin, a metal-clad laminate, and a printed wiring board.

BACKGROUND ART

Patent Literature 1 (JP 2001-283639 A) discloses an insulating resin composition for a build-up substrate. This insulating resin composition for a build-up substrate contains Component A and Component B as essential components thereof. Component A is an epoxy oligomer having two or more epoxy groups. Component B is an epoxy curing agent made of 10-(2,5-dihydroxyphenyl)-10H-9-oxa-10-phosphaphenanthrene-10-oxide or dihydro-3-((6-oxide-6H-dibenz (c,e))(1,2) oxaphosphorin-6-yl)methyl)-2,5-furandione.

The insulating resin composition for a buildup substrate of Patent Literature 1 is a halogen-free composition, exhibits excellent resistance to alkali, for example, and has excellent mechanical properties as well.

However, it is difficult for the insulating resin composition for a buildup substrate of Patent Literature 1 to achieve good dielectric properties. Since communication technologies are expected to go on advancing from now on, the material for printed wiring boards, which play a non-negligible role in the development of high-speed communication technologies, is increasingly required to further improve its dielectric properties and other properties.

CITATION LIST

Patent Literature

Patent Literature 1: JP 2001-283639 A

SUMMARY OF INVENTION

An object of the present disclosure is to provide a resin composition, a prepreg, a film with resin, a sheet of metal foil with resin, a metal-clad laminate, and a printed wiring board, all of which are configured to provide a cured product with a high glass transition temperature (Tg) and excellent dielectric properties, adhesiveness, chemical resistance, and flame resistance.

A resin composition according to an aspect of the present disclosure contains an epoxy compound and a curing agent. The epoxy compound includes a phosphorus-containing epoxy compound having a phosphorus atom in its molecule. The curing agent includes a phosphorus-containing acid anhydride having a phosphorus atom and an acid anhydride group in its molecule.

A prepreg according to another aspect of the present disclosure includes: a base member: and a resin layer made of a semi-cured product of the resin composition. The semi-cured product is impregnated into the base member.

A film with resin according to still another aspect of the present disclosure includes: a resin layer made of a semi-cured product of the resin composition; and a supporting film supporting the resin layer thereon.

A sheet of metal foil with resin according to yet another aspect of the present disclosure includes: a resin layer made of a semi-cured product of the resin composition; and a sheet of metal foil to which the resin layer is bonded.

A metal-clad laminate according to yet another aspect of the present disclosure includes: an insulating layer made of either a cured product of the resin composition or a cured product of the prepreg; and at least one metal layer formed on one surface or both surfaces of the insulating layer.

A printed wiring board according to yet another aspect of the present disclosure includes: an insulating layer made of either a cured product of the resin composition or a cured product of the prepreg; and at least one conductor wiring formed on one surface or both surfaces of the insulating layer.

DESCRIPTION OF EMBODIMENTS (1) Overview

Figure 1:
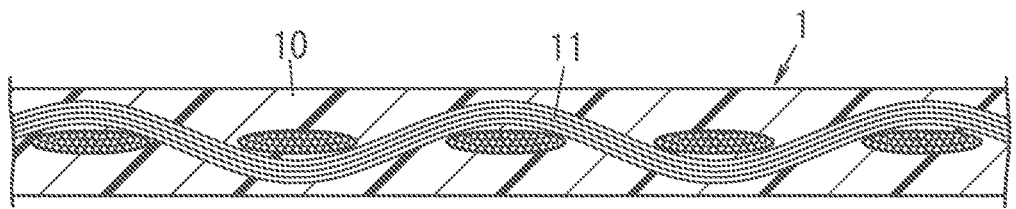
FIG. 1 is a schematic cross-sectional view of a prepreg according to an exemplary embodiment of the present disclosure.

The present inventors paid, while developing a resin composition that would turn into a cured product with excellent dielectric properties, special attention to the fact that a resin with a low dielectric constant has low flame resistance. Attempting to increase the flame resistance by a known technique could cause a decrease in the glass transition temperature (Tg) or adhesiveness. To overcome this problem, the present inventors developed a resin composition with the following composition as a result of extensive research.

A resin composition according to this embodiment includes an epoxy compound and a curing agent. The epoxy compound includes a phosphorus-containing epoxy compound having a phosphorus atom in its molecule. The curing agent includes a phosphorus-containing acid anhydride having a phosphorus atom and an acid anhydride group in its molecule.

One of the features of this embodiment lies in that the resin composition contains both a phosphorus-containing epoxy compound and a phosphorus-containing acid anhydride. Using a phosphorus-containing epoxy compound and a phosphorus-containing acid anhydride in combination in this manner allows providing a cured product with a high glass transition temperature (Tg) and excellent dielectric properties, adhesiveness, chemical resistance, and flame resistance. The cured product may be used to form, for example, an insulating layer 50 of a printed wiring board 5 (see FIG. 5).

Another feature of this embodiment lies in that the phosphorus-containing epoxy compound and the phosphorus-containing acid anhydride may react with each other. Comparing a cured product in which the phosphorus-containing epoxy compound and the phosphorus-containing acid anhydride have reacted with each other (hereinafter referred to as a "first cured product") with a cured product in which the phosphorus-containing epoxy compound and the phosphorus-containing acid anhydride have not reacted with each other (hereinafter referred to as a "second cured product") in a situation where the phosphorus-containing epoxy compound and the phosphorus-containing acid anhydride are used in combination, it can be seen that the first cured product has better flame resistance than the second cured product even if the first cured product and the second cured product have the same phosphorus content.

One of the technical significances of increasing the glass transition temperature (Tg) is as follows. Specifically, if the glass transition temperature (Tg) is high, the solder heat resistance (reflow heat resistance) increases. The increase in the solder heat resistance may reduce the chances of the insulating layer 50 swelling or the conductor wiring 51 being disconnected when electronic components are soldered to the printed wiring board 5 by a reflow process, for example. Among other things, a multilayer printed wiring board with high-density wiring is required to have good solder heat resistance. If the solder heat resistance is sufficiently high, even the multilayer printed wiring board may also ensure sufficient reliability in interlayer connection.

In addition, a cured product with excellent dielectric properties is effectively applicable to a situation where the printed wiring board 5 is used in high-speed communication. Examples of task items to be fulfilled by the printed wiring board 5 for high-speed communication include (1) shortening a signal propagation delay, (2) cutting down the dielectric loss of the signal, (3) controlling the characteristic impedance, and (4) reducing the crosstalk.

To fulfill the task item (1) of shortening the signal propagation delay, the conductor wiring 51 may be shortened (i.e., the wiring may be arranged more densely) and the relative dielectric constant of the insulating layer 50 may be decreased. The lower the relative dielectric constant of the insulating layer 50 is, the higher the propagation rate becomes.

Regarding the task item (2), as the frequency increases, it becomes increasingly important to decrease the dielectric loss tangent as well as the relative dielectric constant.

Regarding the task item (3), examples of parameters of the characteristic impedance include the relative dielectric constant of the insulating layer 50, the thickness of the insulating layer 50, the length of the conductor wiring 51, and the width of the conductor wiring 51. In this case, supposing the characteristic impedance is constant, if the relative dielectric constant of the insulating layer 50 is low, then the insulating layer 50 may have a reduced thickness and therefore has a reduced weight, thus allowing the conductor wiring 51 to be further shortened. That is to say, this contributes to fulfilling the task item (1). In addition, if the relative dielectric constant of the insulating layer 50 is low and the interlayer thickness remains the same, then the width of the conductor wiring 51 may be broadened. This facilitates controlling the characteristic impedance, thus contributing to fulfilling the item (4) of reducing the crosstalk as well.

In addition, a cured product with excellent chemical resistance has resistance to an alkali aqueous solution for use to strip the resist. Even if the resist is formed and stripped repeatedly, the cured product still has resistance to the alkali aqueous solution. The alkali aqueous solution may be, but does not have to be, a sodium hydroxide aqueous solution or a potassium hydroxide aqueous solution, for example. Note that a cured product with excellent chemical resistance hardly has the inside diameter of its hole increased even when subjected to a desmear process.

(2) Details (2.1) Resin Composition

A resin composition according to this embodiment has electrical insulation properties and may be used as a board material for printed wiring boards, for example. Specific examples of board materials include prepregs, films with resin, sheets of metal foil with resin, metal-clad laminates, and printed wiring boards. However, these are only examples and should not be construed as limiting.

The resin composition contains an epoxy compound and a curing agent. The resin composition preferably further contains an inorganic filler. The resin composition may further contain a curing accelerator.

The resin composition may further contain a flame retardant. In that case, the flame retardant is not a flame retardant in a broad sense, but a flame retardant in a narrow sense. That is to say, the flame retardant in a broad sense includes a phosphorus-containing epoxy compound and a phosphorus-containing acid anhydride, but the flame retardant in a narrow sense does not include a phosphorus-containing epoxy compound or a phosphorus-containing acid anhydride. However, comparing a cured product of a resin composition containing no flame retardant (hereinafter referred to as a "third cured product") and a cured product of a resin composition further containing a flame retardant (hereinafter referred to as a "fourth cured product") to each other, the third cured product has better flame resistance than the fourth cured product, even if the third and fourth cured products have the same phosphorus content.

The resin composition may be prepared, for example, in the following manner. Specifically, the epoxy compound and the curing agent are compounded together with an inorganic filler and a curing accelerator added as needed thereto. The compound thus obtained is diluted with an appropriate solvent, and then the mixture is stirred up and blended to have a uniform concentration.

The resin composition has thermosetting properties. When heated, the resin composition turns into a semi-cured product. When further heated, the resin composition turns into a cured product. The semi-cured product is a substance in a semi-cured state, and the cured product is a substance in a cured state (insoluble and non-meltable state). As used herein, the semi-cured state refers to a state in an intermediate stage (stage B) of the curing reaction. The intermediate stage is a stage between the varnished stage (stage A) and the cured stage (stage C).

Next, respective constituent components of the resin composition will be described.

(2.1.1) Epoxy Compound

The epoxy compound is a prepolymer and is a compound having at least two epoxy groups in its molecule. Generally speaking, the term "resin" refers to two different types of resins, namely, a resin as a material yet to be cross-linked (such as an epoxy compound) and a resin as a cross-linked product (final product). As used herein, the "resin" basically refers to the former type of a resin.

In this embodiment, the epoxy compound includes a phosphorus-containing epoxy compound. The phosphorus-containing epoxy compound has a phosphorus atom in its molecule. The phosphorus-containing epoxy compound has reactivity with respect to the phosphorus-containing acid anhydride to be described later.

The phosphorus-containing epoxy compound preferably has the structure expressed by the following Formula (1):

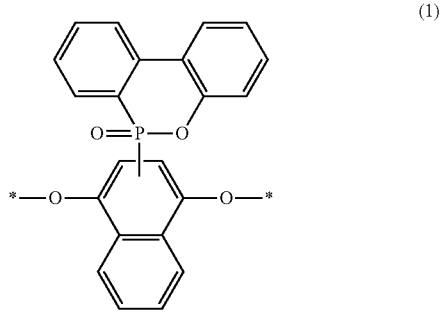

(1)

where * indicates a bond.

If the phosphorus-containing epoxy compound has the structure expressed by this Formula (1), then a cured product having a high glass transition temperature (Tg) and excellent dielectric properties, adhesiveness, chemical resistance, and flame resistance may be obtained easily. Optionally, the phosphorus-containing epoxy compound may have a plurality of structures, each expressed by Formula (1), in its molecule. The phosphorus-containing epoxy compound is not limited to any particular one as long as the phosphorus-containing epoxy compound has a phosphorus atom in its molecule. The phosphorus-containing epoxy compound preferably includes, in its molecule, at least one structure derived from a substance selected from the group consisting of bisphenol A type epoxy compounds, bisphenol F type epoxy compounds, bisphenol S type epoxy compounds, phenyl type epoxy compounds, xylylene type epoxy compounds, arylalkylene type epoxy compounds, triphenylmethane type epoxy compounds, anthracene type epoxy compounds, norbornene type epoxy compounds, fluorene type epoxy compounds, naphthalene type epoxy compounds, dicyclopentadiene type epoxy compounds, 9,10-dihydro-9-oxa-10-phosphaphenantrene-10-oxide, and 10-[2-(dihydroxynaphthyl)]-9,10-dihydro-9-oxa-10-phosphaphenantrene-10-oxide.

Preferably, the epoxy compound further includes a polyfunctional epoxy compound. The polyfunctional epoxy compound does not have a phosphorus atom in its molecule and has at least two epoxy groups in its molecule. If the epoxy compound further includes the polyfunctional epoxy compound, the properties peculiar to the polyfunctional epoxy compound may be imparted to the cured product.

The polyfunctional epoxy compound is not particularly limited, and may be, for example, a bisphenol type epoxy compound, a novolac type epoxy compound, a biphenyl type epoxy compound, a xylylene type epoxy compound, an arylalkylene type epoxy compound, a triphenylmethane type epoxy compound, an anthracene type epoxy compound, a norbornene type epoxy compound, or a fluorene type epoxy compound. The epoxy compound contained in the resin composition may be only one type or two or more types.

Specific examples of the bisphenol type epoxy compounds include bisphenol A type epoxy compounds, bisphenol F type epoxy compounds, and bisphenol S type epoxy compounds. However, these are only examples and should not be construed as limiting.

Specific examples of the novolac type epoxy compounds include phenol novolac type epoxy compounds and cresol novolac type epoxy compounds. However, these are only examples and should not be construed as limiting.

Specific examples of the aryl alkylene type epoxy compounds include phenol aralkyl type epoxy compounds, biphenyl aralkyl type epoxy compounds, biphenyl novolac type epoxy compounds, biphenyl dimethylene type epoxy compounds, trisphenol methane novolac type epoxy compounds, and tetramethyl biphenyl type epoxy compounds. However, these are only examples and should not be construed as limiting.

Preferably, the polyfunctional epoxy compound includes a polyfunctional epoxy compound having at least one of a naphthalene skeleton or a dicyclopentadiene skeleton in its molecule. Among other things, a polyfunctional epoxy compound having a naphthalene skeleton in its molecule will be hereinafter sometimes referred to as a "naphthalene type epoxy compound", and a polyfunctional epoxy compound having a dicyclopentadiene skeleton in its molecule will be hereinafter sometimes referred to as a "dicyclopentadiene type epoxy compound."

The naphthalene skeleton has rigidity and hydrophobicity. Therefore, if the polyfunctional epoxy compound contains a naphthalene-type epoxy compound, then heat resistance, low hygroscopicity, and low linear expansivity may be imparted to the cured product.

Specific examples of the naphthalene type epoxy compounds include naphthalene skeleton-modified cresol novolac type epoxy compounds, naphthalene diol aralkyl type epoxy compounds, naphthol aralkyl type epoxy compounds, methoxy naphthalene modified cresol novolac type epoxy compounds, and methoxy naphthalene dimethylene type epoxy compounds. However, these are only examples and should not be construed as limiting.

The dicyclopentadiene skeleton is a bulky cyclic aliphatic hydrocarbon. Therefore, if the polyfunctional epoxy compound includes a dicyclopentadiene type epoxy compound, then excellent dielectric properties, low hygroscopicity, and heat resistance may be imparted to the cured product.

(2.1.2) Curing Agent

The curing agent contains a phosphorus-containing acid anhydride. The phosphorus-containing acid anhydride has a phosphorus atom and an acid anhydride group in its molecule. The phosphorus-containing acid anhydride has reactivity to the above-described phosphorus-containing epoxy compound.

The phosphorus-containing acid anhydride is not particularly limited, but preferably has, in its molecule, the structure expressed by the following Formula (A) and/or the following Formula (B) and an acid anhydride group, for example. The acid anhydride group preferably contains a cyclic acid anhydride group.

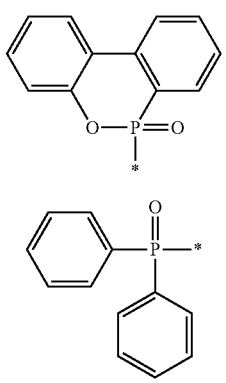

where * indicates a bond.

In particular, the phosphorus-containing acid anhydride preferably includes the structure expressed by this Formula (A) in its molecule. The phosphorus-containing acid anhydride including the structure expressed by Formula (A) in its molecule may be, for example, dihydro-3-((6-oxide-6H-dibenz(c,e)(1,2)) oxaphosphorin-6-ylmethyl)-2,5-furandione expressed by the following Formula (2). A phosphorus-containing acid anhydride expressed by the following Formula (2) facilitates providing a cured product having a high glass transition temperature (Tg) and excellent dielectric properties, adhesiveness, chemical resistance, and flame resistance.

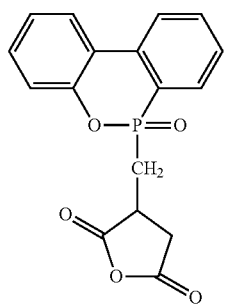

Preferably, the curing agent further contains a phosphorus-free curing agent. The phosphorus-free curing agent has no phosphorus atoms in its molecule. If the curing agent further includes a phosphorus-free curing agent, properties peculiar to the phosphorus-free curing agent may be imparted to the cured product.

Preferably, the phosphorus-free curing agent contains one or more compounds selected from the group consisting of polyfunctional acid anhydrides, alicyclic polyfunctional acid anhydrides, and styrene-maleic anhydride copolymers. Then, the properties peculiar to the polyfunctional acid anhydride, the alicyclic polyfunctional acid anhydride, and the styrene-maleic anhydride copolymer may be imparted to the cured product.

A polyfunctional acid anhydride is a compound having at least two acid anhydride groups in its molecule. The polyfunctional acid anhydride is not particularly limited, but may be, for example, ethylene glycol bisanhydro trimellitate (TMEG), pyromellitic anhydride (PMDA), 3,3',4,4'-biphenyltetracarboxylic dianhydride (BPDA), and 2,2-bis [4(3,4-dicarboxyphenoxylphenyl]propanoic dianhydride (BPADA). By using a polyfunctional acid anhydride, the crosslink density of the cured product tends to be higher than that of a monofunctional acid anhydride (i.e., a compound having a single acid anhydride group in its molecule). Therefore, the polyfunctional acid anhydride may improve the glass transition temperature (Tg) of the cured product.

The alicyclic polyfunctional acid anhydride is a polyfunctional acid anhydride and is a compound having at least one saturated or unsaturated carbon ring having no aromaticity. The alicyclic polyfunctional acid anhydride does not have to be, but may be, for example, 5-(2,5-dioxotetrahydro-3-furanyl)-3-methyl-3-cyclohexene-1,2-dicarboxylic acid anhydride (MCTC) or hydrogenated cyclohexane-1,2,4,5-tetracarboxylic dianhydride (H-PMDA). The alicyclic polyfunctional acid anhydride may reduce the dielectric constant of the cured product. Among other things, hydrogenated alicyclic polyfunctional acid anhydrides are particularly effective. As used herein, "hydrogenation" is synonymous with hydrogenation or hydrogenation reaction.

The styrene-maleic anhydride copolymer is a binary copolymer (copolymer) produced by copolymerization of a styrene monomer and maleic anhydride and is an acid anhydride having two or more acid anhydride groups. The styrene-maleic anhydride copolymer may improve the chemical resistance (alkali resistance, in particular) of the cured product.

Styrene-maleic anhydride copolymers may be classified into alternating copolymers, random copolymers, block copolymers, and graft copolymers according to the difference in arrangement of the styrene monomer and maleic anhydride. Any of these copolymers may be used.

The acid value of the styrene-maleic anhydride copolymer preferably falls within the range from 275 to 550. The acid value is represented by the number of mg of potassium hydroxide required to neutralize free fatty acids present in 1 g of the styrene-maleic anhydride copolymer. If the acid value is equal to or greater than 275, the adhesiveness of the cured product may be improved. Specifically, the peel strength of the metal-clad laminate 4 and the printed wiring board 5 may be increased.

In the styrene-maleic anhydride copolymer, the molar ratio of the styrene monomer to maleic anhydride is not particularly limited. For example, the molar ratio may fall within the range from 1:1 to 3:1.

The weight average molecular weight of the styrene-maleic anhydride copolymer is not limited to any particular value. For example, the weight average molecular weight may fall within the range from 4500 to 9000.

The phosphorus content with respect to the total mass of the epoxy compound and the curing agent preferably falls within the range from 1.3% by mass to 3.7% by mass. If the phosphorus content is equal to or greater than 1.3% by mass, the flame resistance of the cured product may be improved. If the phosphorus content of the cured product is equal to or less than 3.7% by mass, a decrease in the chemical resistance (alkali resistance, in particular) of the cured product may be curbed. Note that if the resin composition further contains a flame retardant, the phosphorus content is based on the total mass of the epoxy compound, the curing agent, and the flame retardant.

The content of the phosphorus-containing acid anhydride preferably falls within the range from 5 parts by mass to 70 parts by mass, more preferably falls within the range from 7 parts by mass to 66 parts by mass, and even more preferably falls within the range from 25 parts by mass to 55 parts by mass, with respect to 100 parts by mass in total of the phosphorus-containing epoxy compound and the phosphorus-containing acid anhydride. If the content of the phosphorus-containing acid anhydride is equal to or greater than 5 parts by mass, a decrease in the flame resistance and glass transition temperature (Tg) of the cured product may be curbed. If the content of the phosphorus-containing acid anhydride is equal to or less than 70 parts by mass, a decrease in the flame resistance of the cured product may be curbed.

The equivalent ratio of the epoxy compound to the curing agent preferably falls within the range from 1:0.75 to 1:1.25. In other words, (equivalent of curing agent)/(equivalent of epoxy compound) falls within the range from 0.75 to 1.25. When the equivalent ratio of the epoxy compound to the curing agent falls within this range, a decrease in the flame resistance and the glass transition temperature (Tg) of the cured product may be curbed.

In this case, the equivalent (eq) of the epoxy compound is obtained by dividing the mass (g) of the epoxy compound contained in the resin composition by the epoxy equivalent (g/eq) of the epoxy compound. The epoxy equivalent is the mass of the epoxy compound containing 1 equivalent of the epoxy group.

If the resin composition contains a plurality of epoxy compounds, the equivalent of the epoxy compounds in the resin composition is the sum of the respective equivalents of those epoxy compounds.

The equivalent (eq) of the curing agent (acid anhydride) is obtained by dividing the mass (g) of the curing agent contained in the resin composition by the acid anhydride equivalent (g/eq) of th curing agent. The acid anhydride equivalent is the mass of the curing agent containing 1 equivalent of the acid anhydride group.

If the resin composition contains a plurality of curing agents, the equivalent of the curing agents in the resin composition is the sum of the respective equivalents of those curing agents.

(2.1.3) Inorganic Filler

The inorganic filler is not limited to any particular one, but may be, for example, silica, calcium carbonate, titanium oxide, kaolin, clay, barium sulfate, zinc oxide, aluminum hydroxide, magnesium hydroxide, talc, mica, wollastonite, potassium titanate, boron aluminum, sepiolite, boron nitride, and silicon nitride. The inorganic filler preferably has a spherical shape.

If the resin composition further contains an inorganic filler, the content of the inorganic filler preferably falls within the range from 20 parts by mass to 150 parts by mass with respect to 100 parts by mass in total of the epoxy compound and the curing agent. If the content of the inorganic filler is equal to or greater than 20 parts by mass, the flame resistance of the cured product may be improved. In addition, the linear expansivity of the cured product may be reduced, the curing shrinkage may also be reduced, and the thermal conductivity may be increased. As a result, the reflow heat resistance may also be improved. Furthermore, in the printed wiring board 5 having two or more layers of conductor wiring 51, the reliability of interlayer connection may also be ensured. If the content of the inorganic filler is 150 parts by mass or less, the cured product may have a low dielectric constant. In addition, the peel strength of the metal-clad laminate 4 and the printed wiring board 5 may also be improved. Furthermore, the flowability may be maintained at a level suitable for molding with a decrease in the flowability of the resin composition curbed during melting.

(2.1.4) Curing Accelerator

The curing accelerator is not limited to any particular one, but may be, for example, an imidazole compound or dicyandiamide. The imidazole compound may be, but does not have to be, 2-ethyl-4-methylimidazole, 2-methylimidazole, 2-undecylimidazole, 2-heptadecylimidazole, 2-phenylimidazole, or 2-phenyl-4-methylimidazole.

(2.2) Prepreg

FIG. 1 illustrates a prepreg 1 according to this embodiment. The prepreg 1 has the shape of a sheet or a film as a whole. The prepreg 1 may be used as a material for a metal-clad laminate 4, as a material for a printed wiring board 5, and to form a printed wiring board 5 with multiple levels (by buildup process).

The prepreg 1 includes a base member 11 and a resin layer 10. The resin layer 10 is made of a semi-cured product of the resin composition impregnated into the base member 11.

A single prepreg 1 includes at least one base member 11. The thickness of the base member 11 is not limited to any particular value but may fall within the range from 8 μm to 100 μm, for example. Specific examples of the base member 11 include woven fabric and non-woven fabric. Specifically, the woven fabric may be, but does not have to be, glass cloth. The non-woven fabric may be, but does not have to be, glass non-woven fabric. The glass cloth and the glass non-woven fabric are formed of glass fibers but may be formed of reinforcing fibers other than glass fibers. Any type of glass may be used without limitation to form the glass fibers. Specific examples of the glass include E glass, T glass, S glass, Q glass, UT glass, NE glass, and L glass. Specific examples of the reinforcing fibers include aromatic polyamide fiber, liquid crystal polyester fiber, poly(paraphenylene benzobisoxazole) (PBO) fiber, and polyphenylene sulfide (PPS) resin fiber. However, these are only examples and should not be construed as limiting.

When heated, the prepreg 1 melts once. After that, the prepreg 1 is cured fully to turn into a cured product. The cured product of the prepreg 1 may constitute the insulating layer of the board.

The thickness of the prepreg 1 is not limited to any particular value but is preferably 120 μm or less, more preferably 100 μm or less, even more preferably 60 μm or less, and most preferably 40 μm or less. This allows the insulating layer to have a reduced thickness, thus reducing the overall thickness of the board as well. The prepreg 1 preferably has a thickness of 10 μm or more.

The resin layer 10 of the prepreg 1 is made of the resin composition according to this embodiment, thus providing a cured product with a high glass transition temperature (Tg) and excellent dielectric properties, adhesiveness, chemical resistance, and flame resistance.

(2.3) Film with Resin

Figure 2A:
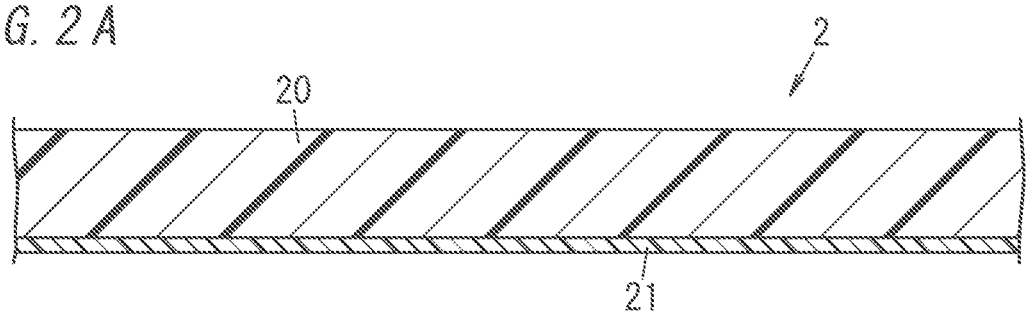
FIG. 2A is a schematic cross-sectional view of a film with resin (and with no protective film) according to the exemplary embodiment of the present disclosure.

FIG. 2A illustrates a film 2 with resin according to this embodiment. The film 2 with resin has the shape of a film or sheet as a whole. The film 2 with resin includes a resin layer 20 and a supporting film 21. The film 2 with resin may be used, for example, to form a printed wiring board 5 with multiple levels (by buildup process).

The resin layer 20 is formed of a semi-cured product of the resin composition. When heated, the semi-cured product may turn into a cured product. In this manner, the resin layer 20 may form an insulating layer.

The thickness of the resin layer 20 is not limited to any particular value but is preferably 120 μm or less, more preferably 100 μm or less, even more preferably 60 μm or less, and most preferably 40 μm or less. This allows the insulating layer to have a reduced thickness, thus reducing the overall thickness of the board as well. The resin layer 20 preferably has a thickness of 10 μm or more.

The supporting film 21 supports the resin layer 20 thereon. Supporting the resin layer 20 in this way allows the resin layer 20 to be handled more easily.

The supporting film 21 may be, but does not have to be, an electrically insulating film, for example. Specific examples of the supporting film 21 include a polyethylene terephthalate (PET) film, a polyimide film, a polyester film, a polyparabanic acid film, a polyether ether ketone film, a polyphenylene sulfide film, an aramid film, a polycarbonate film, and a polyarylate film. However, these are only examples and the supporting film 21 does not have to be one of these films.

A release agent layer (not shown) may be provided on the surface, used to support the resin layer 20, of the supporting film 21. The supporting film 21 may be peeled off as needed from the resin layer 20 by the release agent layer. After the resin layer 20 has been cured to form the insulating layer, the supporting film 21 is preferably peeled off from the insulating layer.

Figure 2B:
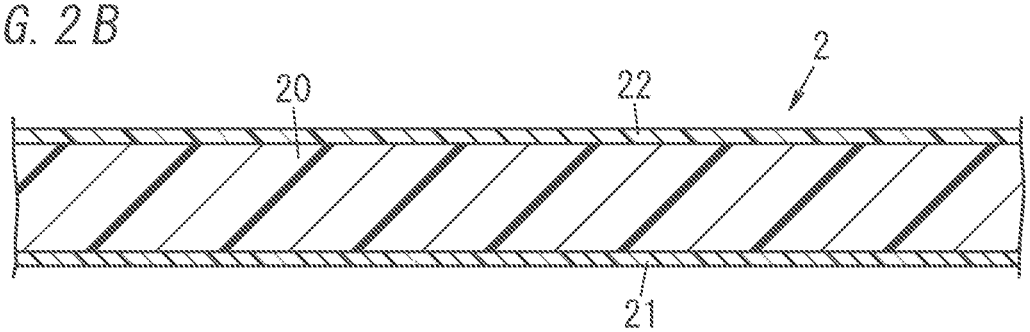
FIG. 2B is a schematic cross-sectional view of a film with resin (and with a protective film) according to the exemplary embodiment of the present disclosure.

Although one surface of the resin layer 20 is covered with the supporting film 21 in the example shown in FIG. 2A, the other surface of the resin layer 20 may be covered with a protective film 22 as shown in FIG. 2B. Covering both surfaces of the resin layer 20 in this manner allows the resin layer 20 to be handled even more easily. This also reduces the chances of foreign particles adhering onto the resin layer 20.

The protective film 22 may be, but does not have to be, an electrically insulating film, for example. Specific examples of the protective film 22 include a polyethylene terephthalate (PET) film, a polyolefin film, a polyester film, and a polymethylpentene film. However, these are only examples and the protective film 22 does not have to be one of these films.

A release agent layer (not shown) may be provided on the surface, laid on top of the resin layer 20, of the protective film 22. The protective film 22 may be peeled off as needed from the resin layer 20 by the release agent layer.

The resin layer 20 of the film 2 with resin is formed of the resin composition according to this embodiment, thus providing a cured product with a high glass transition temperature (Tg) and excellent dielectric properties, adhesiveness, chemical resistance, and flame resistance.

(2.4) Sheet of Metal Foil with Resin

Figure 3:
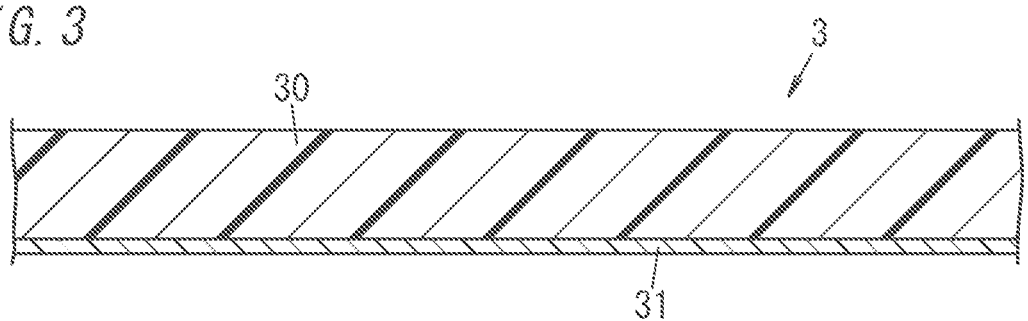
FIG. 3 is a schematic cross-sectional view of a sheet of metal foil with resin according to the exemplary embodiment of the present disclosure.

FIG. 3 illustrates a sheet of metal foil 3 with resin according to this embodiment. The sheet of metal foil 3 with resin has the shape of a film or sheet as a whole. The sheet of metal foil 3 with resin includes a resin layer 30 and a sheet of metal foil 31. The sheet of metal foil 3 with resin may be used to form a printed wiring board 5 with multiple levels (by buildup process).

The resin layer 30 is formed of a semi-cured product of the resin composition. When heated, the semi-cured product may turn into a cured product. In this manner, the resin layer 30 may form an insulating layer.

The thickness of the resin layer 30 is not limited to any particular value but is preferably 120 μm or less, more preferably 100 μm or less, even more preferably 60 μm or less, and most preferably 40 μm or less. This allows the insulating layer, which is formed by curing the resin layer 30, to have a reduced thickness, thus reducing the overall thickness of the board as well. The resin layer 30 preferably has a thickness of 10 μm or more.

The resin layer 30 is bonded onto the sheet of metal foil 31. The sheet of metal foil 31 may specifically be, but does not have to be, a sheet of copper foil. The sheet of metal foil 31 may be patterned into conductor wiring by having unnecessary portions thereof etched away by subtractive process, for example.

The thickness of the sheet of metal foil 31 is not limited to any particular value but is preferably 35 μm or less, and more preferably 18 μm or less. The sheet of metal foil 31 preferably has a thickness of 5 μm or more.

Optionally, the sheet of metal foil 31 may be configured as an extremely thin sheet of metal foil (such as an extremely thin sheet of copper foil) of a so-called "extremely thin sheet of metal foil with a carrier (not shown)." The extremely thin sheet of metal foil with the carrier has a triple layer structure. That is to say, the extremely thin sheet of metal foil with the carrier includes: the carrier; a peelable layer provided on the surface of the carrier; and an extremely thin sheet of metal foil provided on the surface of the peelable layer. The extremely thin sheet of metal foil is too thin to be handled easily by itself and is naturally thinner than the carrier. The carrier is a sheet of metal foil (such as a sheet of copper foil) that plays the role of protecting and supporting the extremely thin sheet of metal foil. The extremely thin sheet of metal foil with the carrier is relatively thick and thick enough to handle easily. The thicknesses of the extremely thin sheet of metal foil and the carrier are not limited to any particular values. For example, the extremely thin sheet of metal foil may have a thickness falling within the range from 1 μm to 10 μm, for example, and the carrier may have a thickness falling within the range from 18 μm to 35 μm. The extremely thin sheet of metal foil may be peeled off as needed from the carrier.

When the extremely thin sheet of metal foil with the carrier is used, the sheet of metal foil 3 with resin may be manufactured in the following manner Specifically, the resin composition is applied onto the surface of the extremely thin sheet of metal foil of the extremely thin sheet of metal foil with the carrier and heated to form a resin layer 30. Thereafter, the carrier is peeled off from the extremely thin sheet of metal foil. The extremely thin sheet of metal foil is bonded as a sheet of metal foil 31 on the surface of the resin layer 30. The peelable layer is preferably peeled off along with the carrier and should not be left on the surface of the extremely thin sheet of metal foil. Nevertheless, even if any part of the peelable layer remains on the surface of the extremely thin sheet of metal foil, the remaining part of the peelable layer is easily removable. The extremely thin sheet of metal foil bonded on the surface of the resin layer 30 may be used as a seed layer in a modified semi-additive process (MSAP). The conductor wiring may be formed by subjecting the seed layer to an electrolytic plating process.

The resin layer 30 of the sheet of metal foil 3 with resin is made of the resin composition according to this embodiment, thus providing a cured product with a high glass transition temperature (Tg) and excellent dielectric properties, adhesiveness, chemical resistance, and flame resistance.

(2.5) Metal-Clad Laminate

Figure 4:
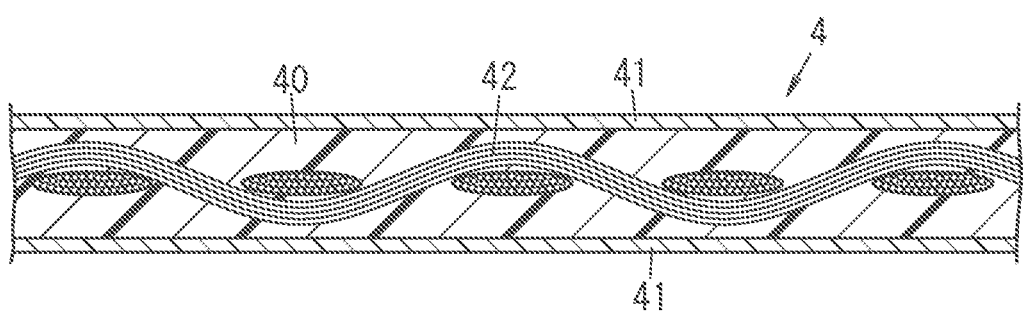
FIG. 4 is a schematic cross-sectional view of a metal-clad laminate according to the exemplary embodiment of the present disclosure.

FIG. 4 illustrates a metal-clad laminate 4 according to this embodiment. The metal-clad laminate 4 includes an insulating layer 40 and a metal layer 41. The metal-clad laminate 4 may be used, for example, as a material for a printed wiring board 5.

The insulating layer 40 is made of either a cured product of the resin composition or a cured product of the prepreg 1. Although the insulating layer 40 includes a single base member 42 in the example illustrated in FIG. 4, the insulating layer 40 may include two or more base members 42.

The thickness of the insulating layer 40 is not limited to any particular value. The smaller the thickness of the insulating layer 40 is, the more effectively the insulating layer 40 contributes to reducing the thickness of the board. The thickness of the insulating layer 40 is preferably 120 μm or less, more preferably 100 μm or less, even more preferably 60 μm or less, and most preferably 40 μm or less. The insulating layer 40 preferably has a thickness of 10 μm or more, and more preferably has a thickness of 15 μm or more.

The metal layer 41 is formed on one surface, or each of the two surfaces, of the insulating layer 40. The metal layer 41 may be, but does not have to be, a sheet of metal foil, for example. The sheet of metal foil may be, but does not have to be, a sheet of copper foil, for example. Although the metal layer 41 is provided on each of the two surfaces of the insulating layer 40 in the example illustrated in FIG. 4, the metal layer 41 may be formed on only one surface of the insulating layer 40. The metal-clad laminate 4 including the metal layers 41 on both surfaces of the insulating layer 40 is a double-sided metal-clad laminate. The metal-clad laminate 4 including the metal layer 41 on only one surface of the insulating layer 40 is a single-sided metal-clad laminate.

The thickness of the metal layer 41 is not limited to any particular value but is preferably 35 μm or less and more preferably 18 μm or less. The metal layer 41 preferably has a thickness of 5 μm or more.

Optionally, the metal layer 41 may be formed out of the extremely thin sheet of metal foil of the extremely thin sheet of metal foil with the carrier. When the extremely thin sheet of metal foil with the carrier is used, the metal-clad laminate 4 may be manufactured in the following manner. Specifically, the extremely thin sheet of metal foil with the carrier may be stacked and formed on one surface or both surfaces of a single prepreg 1. Alternatively, a plurality of prepregs 1 may be stacked one on top of another and the extremely thin sheet of metal foil with the carrier may be stacked and formed on one surface or both surfaces of the stack of the plurality of prepregs 1. In that case, the extremely thin sheet of metal foil of the extremely thin sheet of metal foil with the carrier is stacked on the surface of the prepreg 1. After the stack has been formed, the carrier is peeled off from the extremely thin sheet of metal foil. The extremely thin sheet of metal foil is bonded as the metal layer 41 to the surface of the insulating layer 40, which is a cured product of the prepreg 1. The peelable layer is preferably peeled off along with the carrier and should not be left on the surface of the extremely thin sheet of metal foil. Nevertheless, even if any part of the peelable layer remains on the surface of the extremely thin sheet of metal foil, the remaining part of the peelable layer is easily removable. The extremely thin sheet of metal foil bonded on the surface of the insulating layer 40 may be used as a seed layer in a modified semi-additive process (MSAP). A predetermined part of the seed layer is masked with a plating resist and the rest of the seed layer is subjected to an electrolytic plating process. Thereafter, the plating resist is stripped and the seed layer thus exposed is removed by etching, for example, thereby forming conductor wiring.

The insulating layer 40 of the metal-clad laminate 4 is formed of the resin composition according to this embodiment, and therefore, has a high glass transition temperature (Tg) and exhibits excellent dielectric properties, adhesiveness, chemical resistance, and flame resistance. The glass transition temperature (Tg) thereof is preferably 170° C. or more and the relative dielectric constant thereof is preferably 3.60 or less.

(2.6) Printed Wiring Board

Figure 5:
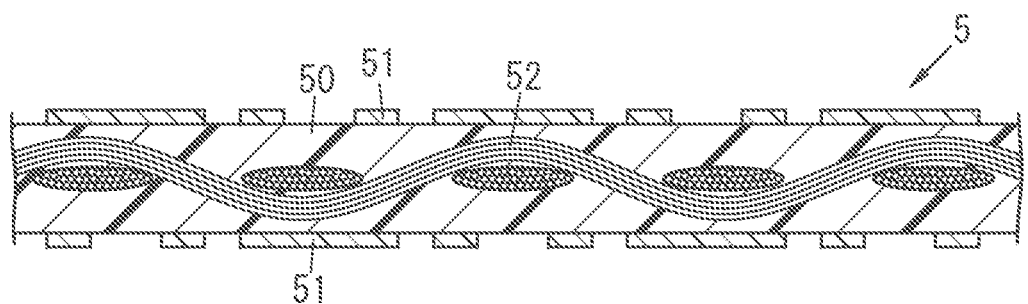
FIG. 5 is a schematic cross-sectional view of a printed wiring board according to the exemplary embodiment of the present disclosure.

FIG. 5 illustrates a printed wiring board 5 according to this embodiment. The printed wiring board 5 includes an insulating layer 50 and conductor wiring 51. As used herein, the "printed wiring board" refers to a board to which no electronic components have been soldered yet and which includes only the wiring thereon.

The insulating layer 50 is made of either a cured product of the resin composition or a cured product of the prepreg 1. The insulating layer 50 may be the same as the insulating layer 40 of the metal-clad laminate 4.

The conductor wiring 51 is formed on one surface or each of the two surfaces of the insulating layer 50. In FIG. 5, the conductor wiring 51 is formed on each of the two surfaces of the insulating layer 50. However, this is only an example and should not be construed as limiting. Alternatively, the conductor wiring 51 may be provided on only one surface of the insulating layer 50. The conductor wiring 51 may be formed by any method without limitation. Examples of methods for forming the conductor wiring 51 include a subtractive process, a semi-additive process (SAP), and a modified semi-additive process (MSAP). Since the adhesiveness of the insulating layer 50 has been increased, even conductor wiring 51 with a narrow width is less likely to peel off from the insulating layer 50. That is to say, the printed wiring board 5 according to this embodiment may realize wiring with increased density.

The insulating layer 50 of the printed wiring board 5 is formed of the resin composition according to this embodiment, and therefore, has a high glass transition temperature (Tg) and exhibits excellent dielectric properties, adhesiveness, chemical resistance, and flame resistance. Thus, the printed wiring board 5 according to this embodiment would be applicable effectively to high-speed communication, in particular.

(Recapitulation)

As can be seen from the foregoing description of embodiments, the present disclosure has the following aspects. In the following description, reference signs are inserted in parentheses just for the sake of clarifying correspondence in constituent elements between the following aspects of the present disclosure and the exemplary embodiments described above.

A resin composition according to a first aspect contains an epoxy compound and a curing agent. The epoxy compound includes a phosphorus-containing epoxy compound having a phosphorus atom in its molecule. The curing agent includes a phosphorus-containing acid anhydride having a phosphorus atom and an acid anhydride group in its molecule.

This aspect provides a cured product with a high glass transition temperature (Tg) and excellent dielectric properties, adhesiveness, chemical resistance, and flame resistance.

In a resin composition according to a second aspect, which may be implemented in conjunction with the first aspect, the epoxy compound further includes a polyfunctional epoxy compound having, in its molecule, no phosphorus atoms and at least two epoxy groups.

This aspect may impart a property peculiar to a polyfunctional epoxy compound to the cured product.

In a resin composition according to a third aspect, which may be implemented in conjunction with the first or second aspect, the curing agent further includes a phosphorus-free curing agent having no phosphorus atoms in its molecule.

This aspect may impart a property peculiar to a phosphorus-free curing agent to the cured product.

In a resin composition according to a fourth aspect, which may be implemented in conjunction with any one of the first to third aspects, phosphorus content falls within a range from 1.3% by mass to 3.7% by mass with respect to a total mass of the epoxy compound and the curing agent.

According to this aspect, setting the phosphorus content at 1.3% by mass or more allows the cured product to have its flame resistance improved. In addition, setting the phosphorus content of the cured product at 3.7% by mass or less allows curbing a decrease in the chemical resistance (in particular, alkali resistance) of the cured product.

In a resin composition according to a fifth aspect, which may be implemented in conjunction with any one of the first to fourth aspects, content of the phosphorus-containing acid anhydride falls within a range from 5 parts by mass to 70 parts by mass with respect to 100 parts by mass in total of the phosphorus-containing epoxy compound and the phosphorus-containing acid anhydride.

According to this aspect, setting the content of the phosphorus-containing acid anhydride at 5 parts by mass or more allows curbing a decrease in the flame resistance and glass transition temperature (Tg) of the cured product. In addition, setting the content of the phosphorus-containing acid anhydride at 70 parts by mass or less curbs a decrease in the flame resistance of the cured product.

In a resin composition according to a sixth aspect, which may be implemented in conjunction with any one of the second to fifth aspects, the polyfunctional epoxy compound includes a polyfunctional epoxy compound having at least one of a naphthalene skeleton or a dicyclopentadiene skeleton in its molecule.

According to this aspect, if the polyfunctional epoxy compound includes a naphthalene type epoxy compound, heat resistance, low hygroscopicity, and low linear expansivity may be imparted to the cured product. If the polyfunctional epoxy compound includes a dicyclopentadiene type epoxy compound, good dielectric properties, low hygroscopicity, and heat resistance may be imparted to the cured product.

In a resin composition according to a seventh aspect, which may be implemented in conjunction with any one of the third to sixth aspects, the phosphorus-free curing agent contains at least one compound selected from the group consisting of polyfunctional acid anhydrides, alicyclic polyfunctional acid anhydrides, and styrene-maleic anhydride copolymers.

This aspect may impart properties peculiar to polyfunctional acid anhydrides, alicyclic polyfunctional acid anhydrides, and styrene-maleic anhydride copolymers to the cured product.

In a resin composition according to an eighth aspect, which may be implemented in conjunction with any one of the first to seventh aspects, the phosphorus-containing epoxy compound has a structure expressed by the following Formula (1):

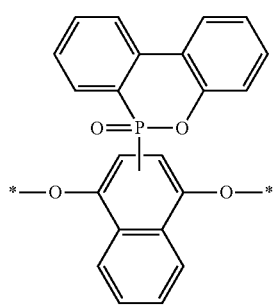

(1)

where * indicates a bond.

This aspect facilitates providing a cured product with a high glass transition temperature (Tg) and excellent dielectric properties, adhesiveness, chemical resistance, and flame resistance.

In a resin composition according to a ninth aspect, which may be implemented in conjunction with any one of the first to eighth aspects, an equivalent ratio of the epoxy compound to the curing agent falls within a range from 1:0.75 to 1:1.25.

According to this aspect, setting the equivalent ratio of the epoxy compound to the curing agent within this range allows curbing a decrease in the flame resistance and glass transition temperature (Tg) of the cured product.

A resin composition according to a tenth aspect, which may be implemented in conjunction with any one of the first to ninth aspects, further contains an inorganic filler. The content of the inorganic filler falls within a range from 20 parts by mass to 150 parts by mass with respect to 100 parts by mass in total of the epoxy compound and the curing agent.

According to this aspect, setting the content of the inorganic filler at 20 parts by mass or more allows reducing the linear expansivity of the cured product, reducing its shrinkage caused by curing, and increasing the thermal conductivity thereof. On the other hand, setting the content of the inorganic filler at 150 parts by mass or less allows curbing a decrease in the flowability of the resin composition during melting.

A prepreg (1) according to an eleventh aspect includes: a base member (11): and a resin layer (10) made of a semi-cured product of the resin composition according to any one of the first to tenth aspects. The semi-cured product is impregnated into the base member (11).

This aspect provides a cured product with a high glass transition temperature (Tg) and excellent dielectric properties, adhesiveness, chemical resistance, and flame resistance.

A film (2) with resin according to a twelfth aspect includes: a resin layer (20) made of a semi-cured product of the resin composition according to any one of the first to tenth aspects; and a supporting film (21) supporting the resin layer (20) thereon.

This aspect provides a cured product with a high glass transition temperature (Tg) and excellent dielectric properties, adhesiveness, chemical resistance, and flame resistance.

A sheet of metal foil (3) with resin according to a thirteenth aspect includes: a resin layer (30) made of a semi-cured product of the resin composition according to any one of the first to tenth aspects; and a sheet of metal foil (31) to which the resin layer (30) is bonded.

This aspect provides a cured product with a high glass transition temperature (Tg) and excellent dielectric properties, adhesiveness, chemical resistance, and flame resistance.

A metal-clad laminate (4) according to a fourteenth aspect includes: an insulating layer (40) made of either a cured product of the resin composition according to any one of the first to tenth aspects or a cured product of the prepreg (1) according to the eleventh aspect; and at least one metal layer (41) formed on one surface or both surfaces of the insulating layer (40).

This aspect allows the insulating layer (40) to have a high glass transition temperature (Tg) and excellent dielectric properties, adhesiveness, chemical resistance, and flame resistance.

A printed wiring board (5) according to a fifteenth aspect includes: an insulating layer (50) made of either a cured product of the resin composition according to any one of the first to tenth aspects or a cured product of the prepreg (1) according to the eleventh aspect; and at least one layer of conductor wiring (51) formed on one surface or both surfaces of the insulating layer (50).

This aspect allows the insulating layer (50) to have a high glass transition temperature (Tg) and excellent dielectric properties, adhesiveness, chemical resistance, and flame resistance.

EXAMPLES

The present disclosure will be described specifically by way of examples. Note that the present disclosure is not limited to the following examples.

(1) Resin Composition

The following materials were provided as materials for the resin composition.

(1.1) Epoxy Compounds

Phosphorus-containing epoxy compound: product name "FX-289-P" manufactured by Nippon Steel & Sumikin Chemical Co., Ltd., having an epoxy equivalent of 390 g/eq and a phosphorus content of 3.5% by mass;

Dicyclopentadiene type epoxy compound: product name "HP-7200HHH" manufactured by DIC Corporation, having an epoxy equivalent of 280 to 290 g/eq and a softening point of 100-105° C.; and Naphthalene type epoxy compound: product name "HP-9500" manufactured by DIC Corporation, having an epoxy equivalent of 230 g/eq.

(1.2) Curing Agent

Phosphorus-containing acid anhydride: dihydro-3-((6-oxide-6H-dibenz(c,e)(1,2) oxaphosphorin-6-yl)methyl)-2,5-furandione, having an acid anhydride equivalent of 332 g/eq, see Formula (2);

Polyfunctional acid anhydride: ethylene glycol bisanhydro trimellitate, product name "Rikacid TMEG-S" manufactured by New Japan Chemical Co., Ltd., having an acid anhydride equivalent of 204 g/eq and a softening point of 64-76° C.;

Alicyclic polyfunctional acid anhydride: 5-(2,5-dioxotetrahydro-3-furanyl)-3-methyl-3-cyclohexene-1,2-dicarboxylic acid anhydride (MCTC), powdered acid anhydride, product name "B-4500" manufactured by DIC Corporation, having an acid anhydride equivalent of 132 g/eq; and Styrene-maleic anhydride copolymer: product name "SMA EF30" manufactured by CRAY VALLEY, styrene: maleic anhydride (molar ratio) =3: 1, having an acid value of 275 to 285 KOHmg/g, an acid anhydride equivalent of 280 g/eq, and a weight average molecular weight of 9500.

(1.3) Inorganic Filler

Silica: product name "VF-40-YE3" manufactured by Zhejiang Huafei Electronic Board Co., Ltd., having a spherical shape, a particle size of 1.51 μm (D50)/top cut of 10 μm.

(1.4) Curing Accelerator

Imidazole compound: 2-ethyl-4-methylimidazole, product name "2E4MZ" manufactured by Shikoku Chemicals Corporation.

(1.5) Flame Retardant

Dispersed Flame Retardant: aluminum phosphinate, product name "OP-935" manufactured by Clariant Japan K. K., having a phosphorus content of 23% by mass; and Reactive flame retardant: product name "Emerald 2000" manufactured by Chemtura Japan Co., Ltd., having a phosphorus content of 9.8% by mass.

These materials for the resin compositions are summarized in Table 1.

TABLE 1

| | | | Manufactured by | Product name and other data |
|---|---|---|---|---|
| Epoxy Compound | Phosphorus-containing epoxy compound | | Nippon Steel & Sumikin Chemical Co., Ltd. | "FX-289-P"; epoxy equivalent: 390 g/eq; phosphorus content: 3.5% by mass |
| | Polyfunctional epoxy compound | Dicyclopentadiene type epoxy compound | DIC Corporation | "HP-7200HHH"; epoxy equivalent: 280 to 290 g/eq; softening point: 100-105° C. |
| | | Naphthalene type epoxy compound | DIC Corporation | "HP-9500"; epoxy equivalent: 230 g/eq |
| Curing Agent | Phosphorus-containing acid anhydride | | — | dihydro-3-((6-oxide-6H-dibenz(c,e)(1,2)oxaphosphorin-6-yl)methyl)-2,5-furandione; acid anhydride equivalent: 332 g/eq, see Formula (2) |
| | Phosphorus-free curing agent | Polyfunctional acid anhydride | New Japan Chemical Co., Etd. | ethylene glycol bisanhydro trimellitate; "Rikacid TMEG-S"; acid anhydride equivalent: 204 g/eq; softening point: 64-76° C. |
| | | Alicyclic polyfunctional acid anhydride | DIC Corporation | "B-4500"; powdered acid anhydride; acid anhydride equivalent: 132 g/eq |
| | | Styrene-maleic anhydride copolymer | CRAY VALLEY | "SMA EF30"; styrene: maleic anhydride (molar ratio) = 3:1; acid value: 275 to 285 KOHmg/g; acid anhydride equivalent: 280 g/eq; weight average molecular weight: 9500 |
| Inorganic Filler | Silica | | Zhejiang Huafei Electronic Board Co., Ltd. | "VF-40-YE3"; spherical; particle size: 1.51 μm (D50)/top cut of 10 μm |
| Curing Accelerator | Imidazole compound | | Shikoku Chemicals Corporation | 2-ethyl-4-methylimidazole, "2E4MZ" |
| Flame Retardant | Dispersed flame retardant | | Clariant Japan K. K. | aluminum phosphinate, "OP-935"; phosphorus content: 23% by mass |
| | Reactive flame retardant | | Chemtura Japan Limited | "Emerald 2000"; phosphorus content: 9.8% by mass |

Then, the epoxy compound, the curing agent, the inorganic filler, the curing accelerator, and the flame retardant were mixed together to have any of the compositions shown in the following Table 2. The mixture was diluted with a solvent (methyl ethyl ketone), and then stirred up and blended to have a uniform concentration. In this manner, a resin composition in a varnish state was prepared.

TABLE 2

| Compound composition (parts by mass) | | | Examples | | | | | | | | |
|---|---|---|---|---|---|---|---|---|---|---|---|
| | | | 1 | 2 | 3 | 4 | 5 | 6 | 7 | 8 | 9 |
| Epoxy compound | Phosphorus-containing epoxy compound | | 21.12 | 12.88 | 12.88 | 12.88 | 12.88 | 42.88 | 8.57 | 23.57 | 12.88 |
| | Polyfunctional epoxy compound | Dicyclopentadiene type epoxy compound | 39.22 | 50.59 | 0 | 38.14 | 43.59 | 27.79 | 53.86 | 35.83 | 55.75 |
| | | Naphthalene type epoxy compound | 0 | 0 | 47.03 | 0 | 0 | 0 | 0 | 0 | 0 |
| Curing agent | Phosphorus-containing acid anhydride | | 23.79 | 14.51 | 14.51 | 14.51 | 14.51 | 3.23 | 16.13 | 26.61 | 14.51 |
| | Phosphorus free curing agent | Polyfunctional acid anhydride | 0 | 0 | 0 | 0 | 29.02 | 0 | 0 | 0 | 0 |
| | | Alicyclic polyfunctional acid anhydride | 15.86 | 22.02 | 25.58 | 0 | 0 | 26.10 | 21.44 | 13.99 | 16.87 |
| | | Styrene-maleic anhydride copolymer | 0 | 0 | 0 | 34.48 | 0 | 0 | 0 | 0 | 0 |
| Inorganic filler | Silica | | 70 | 70 | 70 | 70 | 70 | 70 | 70 | 70 | 70 |
| Curing accelerator | Imidazole compound | | 0.10 | 0.10 | 0.10 | 0.10 | 0.10 | 0.10 | 0.10 | 0.10 | 0.10 |
| Flame retardant | Dispersed flame retardant | | 0 | 0 | 0 | 0 | 0 | 0 | 0 | 0 | 0 |
| | Reactive flame retardant | | 0 | 0 | 0 | 0 | 0 | 0 | 0 | 0 | 0 |

| Compound composition (parts by mass) | | | Examples | | | Comparative Examples | | | | |
|---|---|---|---|---|---|---|---|---|---|---|
| | | | 10 | 11 | 12 | 1 | 2 | 3 | 4 | 5 |
| Epoxy compound | Phosphorus-containing epoxy compound | | 12.88 | 12.88 | 12.88 | 51.43 | 0 | 0 | 12.88 | 0 |
| | Polyfunctional epoxy compound | Dicyclopentadiene type epoxy compound | 46.18 | 50.59 | 50.59 | 21.30 | 60.38 | 61.03 | 52.56 | 61.03 |
| | | Naphthalene type epoxy compound | 0 | 0 | 0 | 0 | 0 | 0 | 0 | 0 |
| Curing agent | Phosphorus-containing acid anhydride | | 14.51 | 14.51 | 14.51 | 0 | 19.35 | 14.51 | 0 | 14.51 |
| | Phosphorus free curing agent | Polyfunctional acid anhydride | 0 | 0 | 0 | 0 | 0 | 0 | 0 | 0 |
| | | Alicyclic polyfunctional acid anhydride | 26.43 | 22.02 | 22.02 | 27.27 | 20.27 | 22.50 | 28.70 | 22.50 |
| | | Styrene-maleic anhydride copolymer | 0 | 0 | 0 | 0 | 0 | 0 | 0 | 0 |

TABLE 2-continued

| | | | | | | | | | |
|---|---|---|---|---|---|---|---|---|---|
| Inorganic filler | Silica | 70 | 20 | 150 | 70 | 70 | 70 | 70 | 70 |
| Curing accelerator | Imidazole compound | 0.10 | 0.10 | 0.10 | 0.10 | 0.10 | 0.10 | 0.10 | 0.10 |
| Flame retardant | Dispersed flame retardant | 0 | 0 | 0 | 0 | 0 | 1.96 | 5.87 | 0 |
| | Reactive flame retardant | 0 | 0 | 0 | 0 | 0 | 0 | 0 | 4.60 |

Table 3 shows the equivalents of the epoxy compound and the curing agent, the equivalent ratio thereof, and the phosphorus contents of the epoxy compound, the curing agent, the flame retardant, and the resin composition.

TABLE 3

| | Examples | | | | | | | | |
|---|---|---|---|---|---|---|---|---|---|
| | 1 | 2 | 3 | 4 | 5 | 6 | 7 | 8 | 9 |
| Equivalent (eq) of epoxy compound | 0.192 | 0.211 | 0.238 | 0.167 | 0.186 | 0.207 | 0.211 | 0.186 | 0.229 |
| Equivalent (eq) of curing agent | 0.192 | 0.211 | 0.238 | 0.167 | 0.186 | 0.207 | 0.211 | 0.186 | 0.171 |
| Equivalent of curing agent/ equivalent of epoxy compound | 1.00 | 1.00 | 1.00 | 1.00 | 1.00 | 1.00 | 1.00 | 1.00 | 0.75 |
| Phosphorus content (mass %) of epoxy compound | 0.74 | 0.45 | 0.45 | 0.45 | 0.45 | 1.50 | 0.30 | 0.83 | 0.45 |
| Phosphorus content (mass %) of curing agent | 2.21 | 1.35 | 1.35 | 1.35 | 1.35 | 0.30 | 1.50 | 2.48 | 1.35 |
| Phosphorus content (mass %) of flame retardant | 0.00 | 0.00 | 0.00 | 0.00 | 0.00 | 0.00 | 0.00 | 0.00 | 0.00 |
| Phosphorus content (mass %) of resin composition | 2.95 | 1.80 | 1.80 | 1.80 | 1.80 | 1.80 | 1.80 | 3.31 | 1.80 |

| | Examples | | | Comparative Examples | | | | |
|---|---|---|---|---|---|---|---|---|
| | 10 | 11 | 12 | 1 | 2 | 3 | 4 | 5 |
| Equivalent (eq) of epoxy compound | 0.195 | 0.211 | 0.211 | 0.207 | 0.212 | 0.214 | 0.217 | 0.214 |
| Equivalent (eq) of curing agent | 0.244 | 0.211 | 0.211 | 0.207 | 0.212 | 0.214 | 0.217 | 0.214 |
| Equivalent of curing agent/ equivalent of epoxy compound | 1.25 | 1.00 | 1.00 | 1.00 | 1.00 | 1.00 | 1.00 | 1.00 |
| Phosphorus content (mass %) of epoxy compound | 0.45 | 0.45 | 0.45 | 1.80 | 0.00 | 0.00 | 0.45 | 0.00 |
| Phosphorus content (mass %) of curing agent | 1.35 | 1.35 | 1.35 | 0.00 | 1.80 | 1.35 | 0.00 | 1.35 |
| Phosphorus content (mass %) of flame retardant | 0.00 | 0.00 | 0.00 | 0.00 | 0.00 | 0.45 | 1.35 | 0.45 |
| Phosphorus content (mass %) of resin composition | 1.80 | 1.80 | 1.80 | 1.80 | 1.80 | 1.80 | 1.80 | 1.80 |

(2) Prepreg

The prepreg was produced by impregnating a piece of glass cloth (product name "7628 type cloth" manufactured by Nitto Boseki Co., Ltd.) as a base member with the resin composition described above, heating and drying the base member at a temperature of 110-140° C. by using a non-contact type heating unit, and removing the solvent from the resin composition to semi-cure the resin composition. The resin content (content of the resin composition) of the prepreg fell within the range from 65% by mass to 75% by mass with respect to the total mass of the prepreg.

(3) Metal-Clad Laminate

The metal-clad laminate was produced as a copper-clad laminate by stacking eight prepregs (340 mm×510 mm) one on top of another with each prepreg sandwiched between two sheets of copper foil (ST foil manufactured by Mitsui Mining & Smelting Co., Ltd., having a thickness of 18 μm) such that rough surfaces thereof faced inward and by heating the multilayer stack under pressure to form the stack into a desired shape. The stack was heated under the pressure on the condition including 180° C., 2.94 MPa, and 60 minutes.

(4) Test (4.1) Glass Transition temperature (Tg)

The glass transition temperature of the prepreg was measured using a viscoelastic spectrometer "DMS6100" manufactured by Seiko Instruments Inc. Specifically, the measurement was performed with the frequency set at 10 Hz in a bending module, and the temperature at which tan a reached a local maximum when the temperature was increased from room temperature to 280° C. under the condition including a temperature increase rate of 5° C./min was regarded as the glass transition temperature.

(4.2) Relative Dielectric Constant (Dk)

The relative dielectric constant of the copper-clad laminate at 1 GHz was measured, with an "Impedance/Material Analyzer 4291A" manufactured by Hewlett-Packard, in compliance with the IPC-TM-650 2.5.5.9 standard.

(4.3) Peel Strength

The peeling strength of the sheet of copper foil (with a thickness of 18 μm) on the surface of the copper-clad laminate was measured in compliance with the JIS C 6481 standard. Specifically, the sheet of copper foil was peeled off at a rate of about 50 mm per minute, and the peeling strength (kN/m) in such a situation was measured as the peel strength.

(4.4) Alkali Resistance

A copper-clad laminate with a plate thickness of 0.8 mm was manufactured in the same manner as described above. The sheet of copper foil was removed by etching from the surface of the copper-clad laminate, and then immersed in an aqueous solution of sodium hydroxide (10% by mass) at 70° C. for 30 minutes. Then, the mass reduction ratio was calculated based on the masses before and after the immersion. Based on the results of this test, the copper-clad laminates were graded as follows and as shown in the following Table 4:

Grade A: when the mass reduction ratio fell within the range from 0% by mass to less than 0.2% by mass;
Grade B: when the mass reduction ratio fell within the range from 0.2% by mass to less than 0.3% by mass; or
Grade C: when the mass reduction ratio was equal to or greater than 0.3% by mass.

(4.5) Flame Resistance

Copper-clad laminates, having plate thicknesses of 0.8 mm, 1.2 mm, and 1 6 mm, respectively, were manufactured in the same way as described above by adjusting the number of prepregs. After the sheet of copper foil had been removed by etching from the surface of each copper-clad laminate, a flame resistance test was conducted in accordance with "Test for Flammability of Plastic Materials-UL 94" by Underwriters Laboratories to grade the copper-clad laminates in terms of their flame resistance. The copper-clad laminate that satisfied V-0 was graded "OK", and the copper-clad laminate that did not satisfy V-0 was graded "NG." The following Table 4 shows the plate thickness and whether or not V-0 was satisfied at that plate thickness:

"1.6 mm OK" indicates that all of the copper-clad laminates with thicknesses of 1.6 mm, 1.2 mm, and 0.8 mm, respectively, were OK;

"1.2 mm OK" indicates that the copper-clad laminate with a thickness of 1.6 mm was NG but the copper clad-laminates with thicknesses of 1.2 mm and 0.8 mm, respectively, were OK; and "0.8 mm NG" indicates that all of the copper-clad laminates with thicknesses of 1.6 mm, 1.2 mm, and 0.8 mm, respectively, were NG.

TABLE 4

| | Examples | | | | | | | | |
|---|---|---|---|---|---|---|---|---|---|
| | 1 | 2 | 3 | 4 | 5 | 6 | 7 | 8 | 9 |
| Glass transition temperature (Tg) (° C.) | 190 | 205 | 230 | 178 | 180 | 173 | 200 | 180 | 190 |
| Relative dielectric constant (Dk) | 3.50 | 3.45 | 3.58 | 3.52 | 3.57 | 3.59 | 3.48 | 3.52 | 3.55 |
| Peel strength (kN/m) | 1.10 | 1.23 | 1.20 | 1.05 | 1.08 | 1.12 | 1.24 | 1.05 | 1.26 |
| Alkali resistance | A | A | A | A | A | A | A | A | A |
| Flame resistance | 1.6 mm OK | 1.2 mm OK | 1.6 mm OK | 1.6 mm OK | 1.6 mm OK | 1.2 mm OK | 1.2 mm OK | 1.6 mm OK | 1.2 mm OK |

| | Examples | | | Comparative Examples | | | | |
|---|---|---|---|---|---|---|---|---|
| | 10 | 11 | 12 | 1 | 2 | 3 | 4 | 5 |
| Glass transition temperature (Tg) (° C.) | 191 | 208 | 200 | 165 | 168 | 155 | 150 | 163 |
| Relative dielectric constant (Dk) | 3.54 | 3.39 | 3.55 | 3.62 | 3.42 | 3.46 | 3.64 | 3.52 |
| Peel strength (kN/m) | 1.25 | 1.26 | 1.13 | 1.10 | 1.00 | 0.85 | 0.83 | 1.05 |
| Alkali resistance | A | A | A | B | B | B | C | B |
| Flame resistance | 1.2 mm OK | 1.2 mm OK | 1.6 mm OK | 0.8 mm NG | 0.8 mm NG | 0.8 mm NG | 0.8 mm NG | 1.2 mm OK |

REFERENCE SIGNS LIST

1 Prepreg
10 Resin Layer
11 Base Member
2 Film with Resin
20 Resin Layer
21 Supporting Film
22 Protective Film
3 Sheet of Metal Foil with Resin
30 Resin Layer
31 Sheet of Metal Foil 4 Metal-Clad Laminate
40 Insulating Layer
41 Metal Layer
5 Printed Wiring Board
50 Insulating Layer
51 Conductor Wiring

The invention claimed is:

1. A resin composition comprising an epoxy compound and a curing agent,
   the epoxy compound including a phosphorus-containing epoxy compound having a phosphorus atom in its molecule,
   the curing agent including a phosphorus-containing acid anhydride having a phosphorus atom and an acid anhydride group in its molecule.

2. The resin composition of claim 1, wherein
   the epoxy compound further includes a polyfunctional epoxy compound having, in its molecule, no phosphorus atoms and at least two epoxy groups.

3. The resin composition of claim 1, wherein
   the curing agent further includes a phosphorus-free curing agent having no phosphorus atoms in its molecule.

4. The resin composition of claim 1, wherein
   phosphorus content falls within a range from 1.3% by mass to 3.7% by mass with respect to a total mass of the epoxy compound and the curing agent.

5. The resin composition of claim 1, wherein
   content of the phosphorus-containing acid anhydride falls within a range from 5 parts by mass to 70 parts by mass with respect to 100 parts by mass in total of the phosphorus-containing epoxy compound and the phosphorus-containing acid anhydride.

6. The resin composition of claim 2, wherein
   the polyfunctional epoxy compound includes a polyfunctional epoxy compound having at least one of a naphthalene skeleton or a dicyclopentadiene skeleton in its molecule.

7. The resin composition of claim 3, wherein
   the phosphorus-free curing agent contains at least one compound selected from the group consisting of polyfunctional acid anhydrides, alicyclic polyfunctional acid anhydrides, and styrene-maleic anhydride copolymers.

8. The resin composition of claim 1, wherein
   the phosphorus-containing epoxy compound has a structure expressed by the following Formula (1):

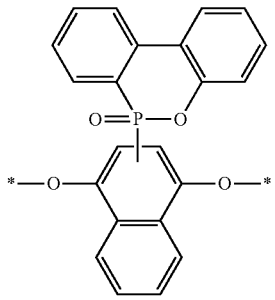

(1)

where * indicates a bond.

9. The resin composition of claim 1, wherein
   an equivalent ratio of the epoxy compound to the curing agent falls within a range from 1:0.75 to 1:1.25.

10. The resin composition of claim 1, further containing an inorganic filler, wherein
    content of the inorganic filler falls within a range from 20 parts by mass to 150 parts by mass with respect to 100 parts by mass in total of the epoxy compound and the curing agent.

11. A prepreg comprising: a base member: and a resin layer made of a semi-cured product of the resin composition of claim 1, the semi-cured product being impregnated into the base member.

12. A film with resin comprising: a resin layer made of a semi-cured product of the resin composition of claim 1; and a supporting film supporting the resin layer thereon.

13. A sheet of metal foil with resin, comprising: a resin layer made of a semi-cured product of the resin composition of claim 1; and a sheet of metal foil to which the resin layer is bonded.

14. A metal-clad laminate comprising: an insulating layer made of a cured product of the resin composition of claim 1; and at least one metal layer formed on one surface or both surfaces of the insulating layer.

15. A printed wiring board comprising: an insulating layer made of a cured product of the resin composition of claim 1; and at least one layer of conductor wiring formed on one surface or both surfaces of the insulating layer.

16. A metal-clad laminate comprising: an insulating layer made of a cured product of the prepreg of claim 11; and at least one metal layer formed on one surface or both surfaces of the insulating layer.

17. A printed wiring board comprising: an insulating layer made of a cured product of the prepreg of claim 11; and at least one layer of conductor wiring formed on one surface or both surfaces of the insulating layer.

18. The resin composition of claim 6, wherein
    the polyfunctional epoxy compound includes a polyfunctional epoxy compound having a dicyclopentadiene skeleton in its molecule.

* * * * *